United States Patent
Yoon

(10) Patent No.: US 7,012,844 B2
(45) Date of Patent: Mar. 14, 2006

(54) DEVICE INFORMATION WRITING CIRCUIT

(75) Inventor: Hyuck Soo Yoon, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 29 days.

(21) Appl. No.: 10/879,130

(22) Filed: Jun. 30, 2004

(65) Prior Publication Data

US 2005/0195665 A1 Sep. 8, 2005

(30) Foreign Application Priority Data

Mar. 6, 2004 (KR) .................. 10-2004-0015258

(51) Int. Cl.
*G11C 7/00* (2006.01)
*G11C 29/00* (2006.01)

(52) U.S. Cl. ............. 365/200; 365/230.03; 365/230.04

(58) Field of Classification Search ................. 365/200
See application file for complete search history.

(56) References Cited

U.S. PATENT DOCUMENTS

| 2002/0031017 A1* | 3/2002 | Yumoto ................. 365/200 |
|---|---|---|
| 2002/0044489 A1* | 4/2002 | Kim ..................... 365/200 |
| 2003/0072199 A1* | 4/2003 | Honda et al. ............. 365/200 |
| 2003/0076714 A1* | 4/2003 | Suzuki .................. 365/200 |
| 2003/0103394 A1* | 6/2003 | Koshikawa ............... 365/200 |
| 2003/0117869 A1* | 6/2003 | Hidaka .................. 365/200 |

* cited by examiner

*Primary Examiner*—Hoai Ho
*Assistant Examiner*—Kretelia Graham
(74) *Attorney, Agent, or Firm*—Heller Ehrman LLP

(57) ABSTRACT

A device information writing circuit features a redundancy fuse set for selectively performing a repair operation or a device information writing operation. The repair operation is performed with a fuse set having the least frequency of use from the redundancy fuse sets of a row address. Additionally, the number of fuse sets is reduced because the device information including the LOT number, the wafer number and row/column coordinates is written as different data in each bank by a fuse cutting method.

20 Claims, 5 Drawing Sheets

DEVICE INFORMATION WRITING CIRCUIT

BACKGROUND OF THE INVENTION

1. Field of the Invention

The present invention generally relates to a device information writing circuit, and more specifically, to a technology of performing a repair operation and a device information writing operation with a redundancy fuse set, thereby reducing the number of fuse sets.

2. Description of the Prior Art

In general, a fuse circuit has been widely used for analysis and repair during memory design. Additionally, a memory requires much more fuse options as the memory becomes more integrated.

FIG. 1 is a diagram of a conventional redundancy information output circuit.

The conventional redundancy information output circuit comprises a row address comparison unit 1, a column address comparison unit 2, a row/column repair information control unit 3 and a data output unit 4.

The row address comparison unit 1 compares an inputted row address with an row address of a defective cell to be repaired, and outputs a repair acknowledgement signal HITBI including repair information of the row address resulting from the comparison result.

The column address comparison unit 2 compares an inputted column address with an column of defective cell address to be repaired, and outputs repair information of the column address.

The row/column repair information control unit 3 synthesizes repair information of row/column address applied from the row address comparison unit 1 and the column address comparison unit 2, and outputs the synthesized information to the data output unit 4.

The data output unit 4 controls whether repair information of the input address to a DQ pin is outputted in response to a test mode signal TRC for acknowledging the repaired address. Here, the data output unit 4 compares output signals from an address fuse set, and outputs high data to the DQ pin when all addresses are identical.

Accordingly, the conventional redundancy fuse set circuit selectively outputs the repaired address information by controlling the test mode signal TRC depending on the address comparison result when an enable fuse is cut. When device information is written in the conventional redundancy fuse set circuit with additional repair fuse sets, the same data are used in each bank to identify whether the inputted address is a repair address or a device information writing address. As a result, four fuse sets are required on a basis of four banks to store one data.

In this case, the LOT number, which represent the number of wafers under the same process condition, and 16 fuse sets are required in at least four banks to write the wafer number and row/column information.

SUMMARY OF THE INVENTION

Accordingly, it is an object of the present invention to provide a device information writing circuit configured to select a subsequent repair operation and a device information writing operation with a redundancy fuse set having relatively low frequency of use, thereby reducing the number of fuse sets.

In an embodiment, a device information writing circuit comprises a row address comparison unit, an information writing unit, an information write control unit and a data output unit. The row address comparison unit comprising a plurality of fuse sets selects a fuse set corresponding to an inputted row address, and outputs an address comparison signal and fuse enable signal depending on the fuse cutting result of the selected fuse set. The information writing unit selectively outputs a repair acknowledgement signal or a device information signal in response to the fuse enable signal and a device information test signal for reading device information. The information write control unit selectively outputs the device information or repair information in response to the repair acknowledgement signal, the device information signal and the device information test signal. The data output unit outputs the device information to an external data output pin in response to the device information test signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
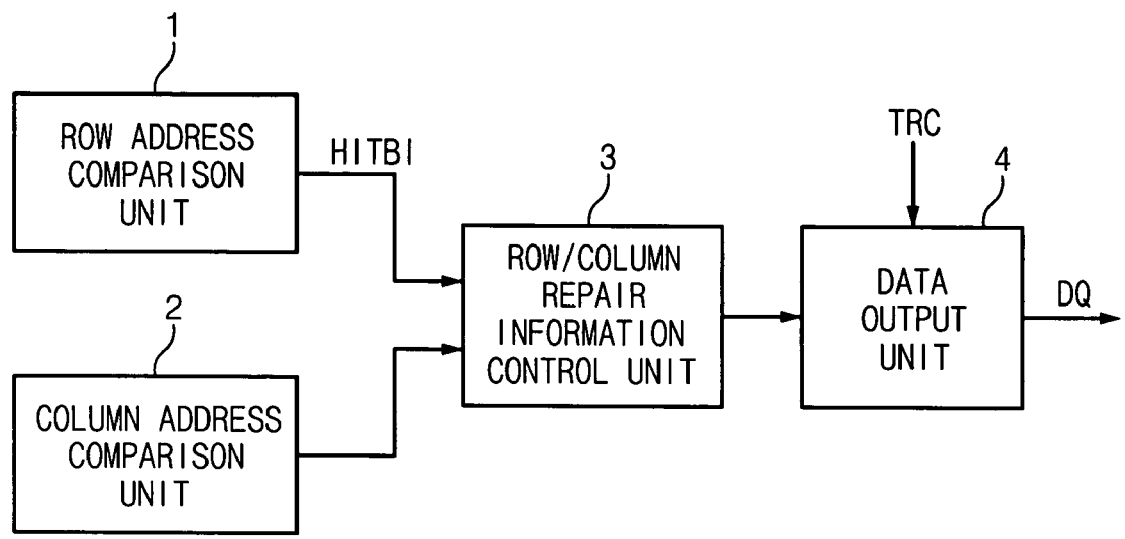
FIG. 1 is a diagram of a conventional redundancy information output circuit.
Figure 2:
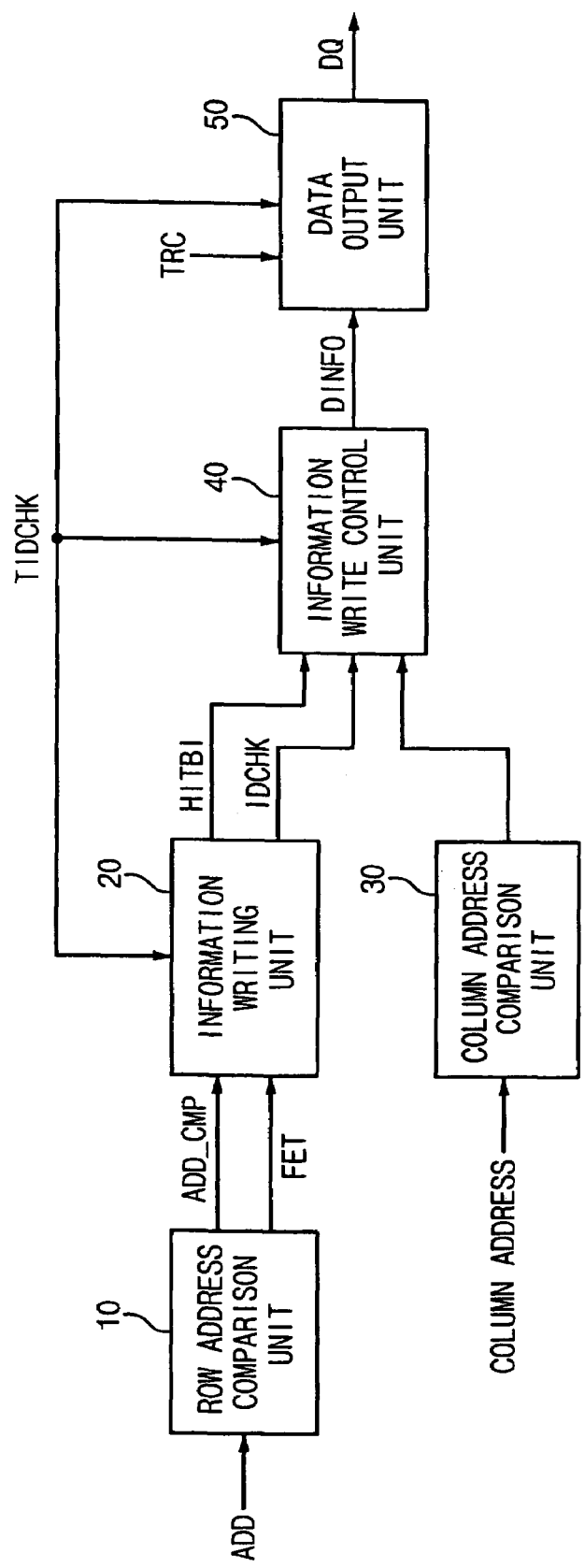
FIG. 2 is a diagram of a device information writing circuit according to an embodiment of the present invention.

FIG. 2 is a diagram of a device information writing circuit according to an embodiment of the present invention.

In an embodiment, the device information writing circuit comprises a row address comparison unit 10, an information writing unit 20, a column address comparison unit 30, an information write control unit 40 and a data output unit 50.

The row address comparison unit 10 comprises a plurality of fuse sets for repair. The row address comparison unit 10 selectively cuts a fuse set corresponding to an inputted row address ADD, and outputs an address comparison signal ADD_CMP and a fuse enable signal FET depending on the fuse cutting result.

The information writing unit 20 selectively enables a repair acknowledgement signal HITBI for performing a repair operation and a device information signal IDCHK in response to the address comparison signal ADD_CMP and a fuse enable signal FET applied from the row address comparison unit 10, and a device information test signal TIDCHK.

The information writing unit 20 repairs the inputted row address ADD when the fuse enable signal FET is enabled, and enables the repair acknowledgement signal HITBI including repair information of the row address. On the other hand, when the device information test signal TIDCHK is enabled and the fuse enable signal FET is disabled, the information writing unit 20 enables the device information signal IDCHK.

The column address comparison unit 30 compares an inputted column address with an address of defected cell to be repaired, and outputs repair information of the column address depending on the comparison result.

The information write control unit 40 selectively outputs row/column address repair information or a device information output signal DINFO in response to the device information test signal TIDCHK.

In other words, when the device information test signal TIDCHK is disabled, the information write control unit 40 synthesizes row/column address repair information applied from the information writing unit 20 and the column address comparison unit 30, and outputs the synthesized information. On the other hand, when the device information test signal TIDCHK is enabled, the information write control unit 40 outputs a device information output signal DINFO to the data output unit 50 by selecting the device information signal IDCHK applied to the information writing unit 20.

The data output unit 50 selectively outputs the repair information or the device information output signal DINFO in response to the device information test signal TIDCHK and the test mode signal TRC.

That is, when the device information test signal TIDCHK is disabled, the data output unit 50 determines whether it outputs the repair information of the inputted address in response to the test mode signal TRC for identifying the repaired address. Here, the data output unit 50 compares output signals from the address fuse sets, and outputs high data to a DQ pin when all addresses are identical.

On the other hand, when the device information test signal TIDCHK for reading device information is enabled, the data output unit 50 outputs the device information output signal DINFO applied from the information write control unit 40 to the PD pin.

Figure 3:
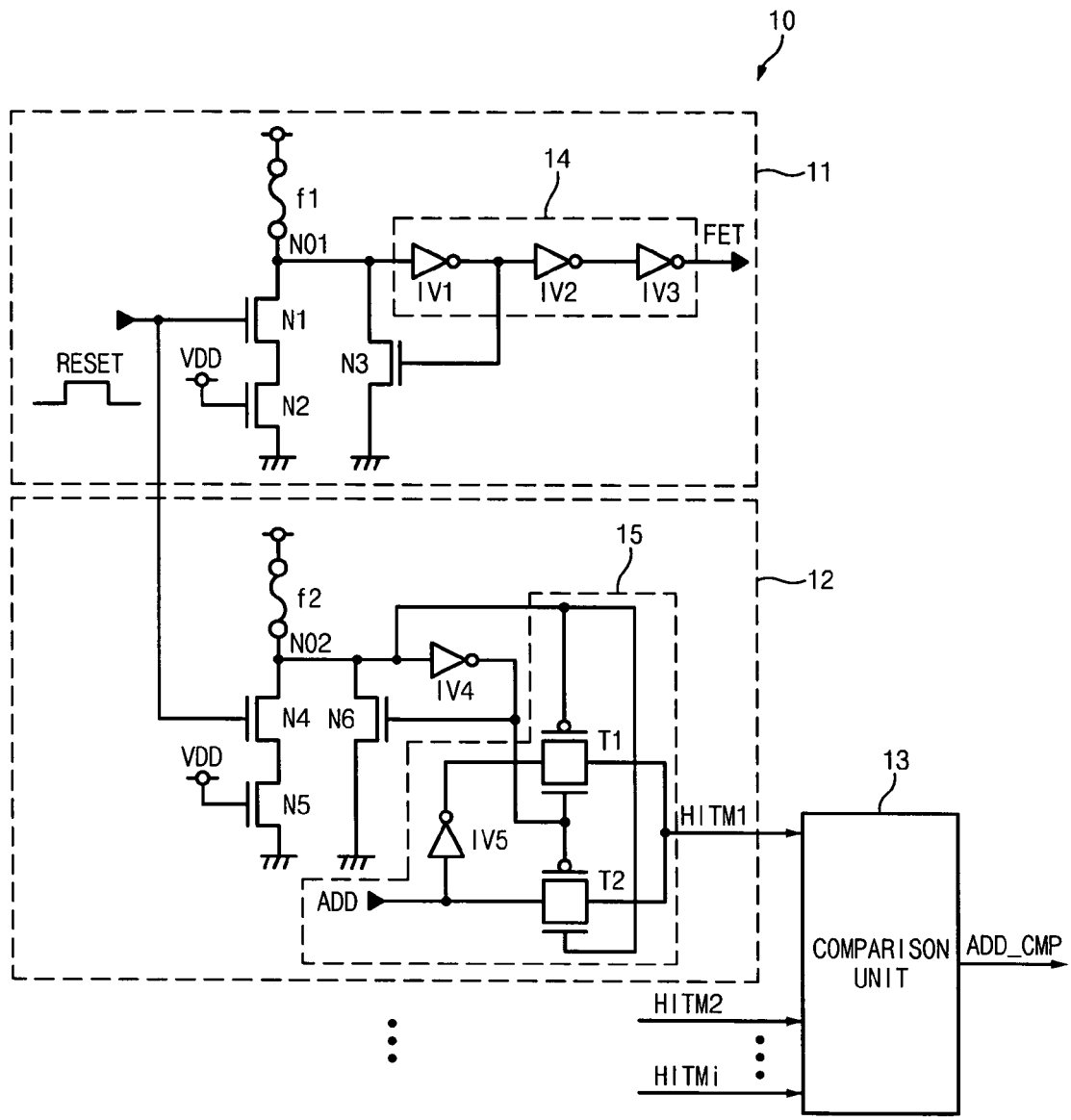
FIG. 3 is a circuit diagram of a row address comparison unit of FIG. 2.

FIG. 3 is a circuit diagram of the row address comparison unit 10 of FIG. 2.

The row address comparison unit 10 comprises an enable fuse unit 11 where current flows basically at a reset mode, and a plurality of address fuse units 12 where the flow of current is controlled by the enable fuse unit 11.

Here, the enable fuse unit 11 comprises a fuse f1, NMOS transistors N1~N3, a driving unit 14. The fuse f1 is connected between a power voltage terminal and the NMOS transistor N1. The NMOS transistor N1 connected between the fuse f1 and the NMOS transistor N2, is controlled by a reset signal RESET. That is, if the reset signal RESET is enabled, the NMOS transistor N1 is turned on to change an output value of a node NO1 depending on the connection state of the fuse f1.

The NMOS transistor N2 as a constant-current device, which is connected between the NMOS transistor N1 and a ground voltage terminal, is constantly turned on by a power voltage VDD.

The driving unit 14 which comprises a plurality of inverters IV1~IV3 connected serially buffers the output signal from the node NO1, and outputs the fuse enable signal FET.

The NMOS transistor N3 has a source connected to a ground voltage terminal, a drain connected to an input terminal of the inverter IV1, and a gate connected to an output terminal of the inverter IV1. That is, the NMOS transistor N3 precharges the input terminal of the inverter IV1 in response to an output signal from the inverter IV1.

Each of the plurality of address fuse units 12 comprises a fuse f2, NMOS transistors N4~N6, an inverter IV4 and a transmission unit 15.

The fuse f2 is connected between the power voltage terminal and the NMOS transistor N4. The NMOS transistor N4, connected between the fuse f2 and the NMOS transistor N5, is controlled by the reset signal RESET. If the reset signal RESET is enabled, the NMOS transistor N4 is turned on to change a potential of a node NO2 depending on the connection state of the fuse f1.

The NMOS transistor N5 as a constant-current device, which is connected between the NMOS transistor N4 and the ground voltage terminal, is constantly turned on by the power voltage VDD.

The inverter IV4 inverts an output signal from the node NO2. The NMOS transistor N6 has a drain connected to an input terminal of the inverter IV4, a source connected to the ground voltage, and a gate connected to an output terminal of the inverter IV4. The NMOS transistor N6 precharges the input terminal of the inverter IV4 in response to an output signal from the inverter IV4.

The transmission unit 15 comprises an inverter IV5, and transmission gates T1 and T2.

The inverter IV5 inverts an inputted address ADD. The transmission gate T1 selectively controls whether the inverted address ADD by the connection state of the fuse f2 is outputted, and outputs a fuse selecting signal HITM1. The transmission gate T2 selectively controls whether the address ADD depending on the connection state of the fuse f2 is outputted, and outputs the fuse selecting signal HITM1.

The comparison unit 13 compares a plurality of fuse selecting signals HITMi applied from the plurality of address fuse units 12. When the fuse f2 corresponding to the row address is cut in the address fuse unit 12, all fuse selecting signals HITMi are outputted at a high level. As a result, the comparison unit 13 enables the address comparison signal ADD_CMP to a high level when all fuse selecting signals HITMi are identical at the high level.

Hereinafter, the operation of the row address comparison unit 10 of FIG. 3 is described.

In the above-described enable fuse unit 11, the NMOS transistor N1 is turned on when the reset signal RESET is applied as a pulse type to check whether the fuse f1 is turned on or off. When the NMOS transistor N1 is turned on, through-current IDD flows. Here, a high level signal is outputted from the node NO1 if the fuse f1 is connected, and a low level signal is outputted from the node NO1 if the fuse f1 is disconnected. As a result, when a repair circuit is operated, that is, the enable fuse f1 is cut, the enable fuse unit 11 enables the fuse enable signal FET to the high level.

The address fuse unit 12 outputs the fuse selecting signal HITMi having a phase opposite to that of the input address ADD when the fuse f2 is cut, and outputs the input address ADD as the fuse selecting signal HITMi when the fuse f2 is not cut.

In this way, the row address comparison unit 10, which comprises the enable fuse unit 11 connected in parallel to the plurality of address fuse units 12, operates the plurality of address fuse units 12 when the enable fuse unit 11 is enabled, and stores address information in the comparison unit 13.

Figure 4:
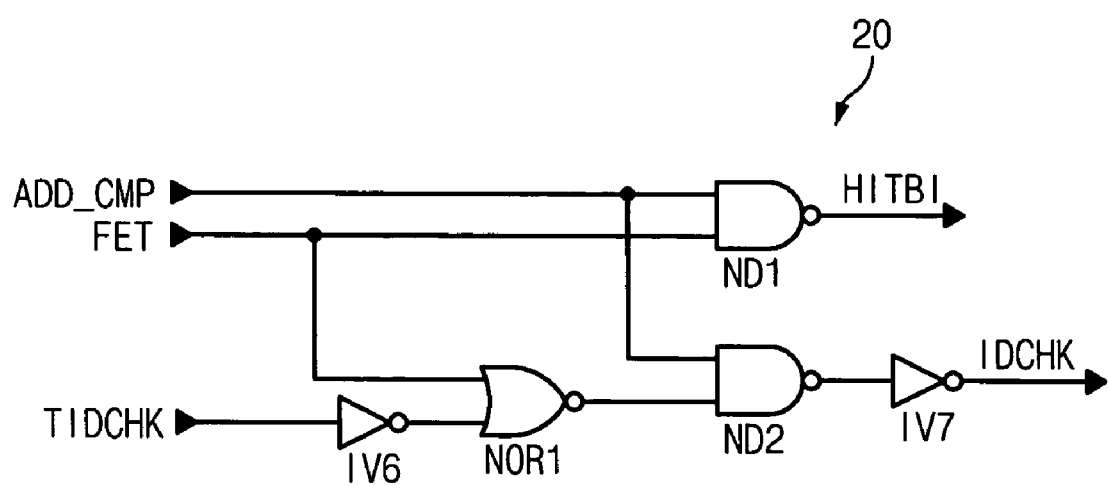
FIG. 4 is a circuit diagram of an information writing unit of FIG. 2.

FIG. 4 is a circuit diagram of the information writing unit 20 of FIG. 2.

The information writing unit 20 comprises inverters IV6 and IV7, a NOR gate NOR1, and NAND gates ND1 and ND2.

The inverter IV6 inverts the device information test signal TIDCHK. The NOR gate NOR1 performs a NOR operation on an output signal from the inverter IV6 and the fuse enable signal FET. The NAND gate ND1 performs a NAND operation on the address comparison signal ADD_CMP and the fuse enable signal FET, and outputs the repair acknowledgement signal HITBI. The NAND gate ND2 performs a NAND operation on the address comparison signal ADD_CMP and an output signal from the NOR gate NOR1.

The inverter IV7 inverts an output signal from the NAND gate ND2, and outputs the device information signal IDCHK.

The above-described information writing unit 20 can selectively perform a general repair operation or a device information writing operation with a fuse set having relatively low frequency of use from row repair fuse sets.

Hereinafter, the operation of the information writing unit 20 of FIG. 4 is described.

Suppose that a fuse set having the least usage frequency is the final fuse set in an embodiment of the present invention.

If the information writing unit 20 receives the fuse enable signal FET having the high level, the information writing unit 20 enables the repair acknowledgement signal HITBI to the high level to output row address repair information to the information write control unit 40. Here, the device information test signal TIDCHK for reading device information is maintained at a disable state which is a low level.

On the other hand, the information writing unit 20 is used for the device information writing operation, if the enable fuse is not cut, the fuse enable signal FET is disabled to the low level, and the device information test signal TIDCHK is enabled to the high level.

As a result, if the device information signal IDCHK is enabled to a high level, the information writing unit 20 outputs information (for example, binary numbers) such as the LOT number, the wafer number and row/column address coordinates which correspond to device information. AT the device information writing operation, the repair acknowledgement signal HITBI is disabled to the low level, the information writing unit 20 does not output the row address repair information for the repair circuit operation to the information write control unit 40

Figure 5:
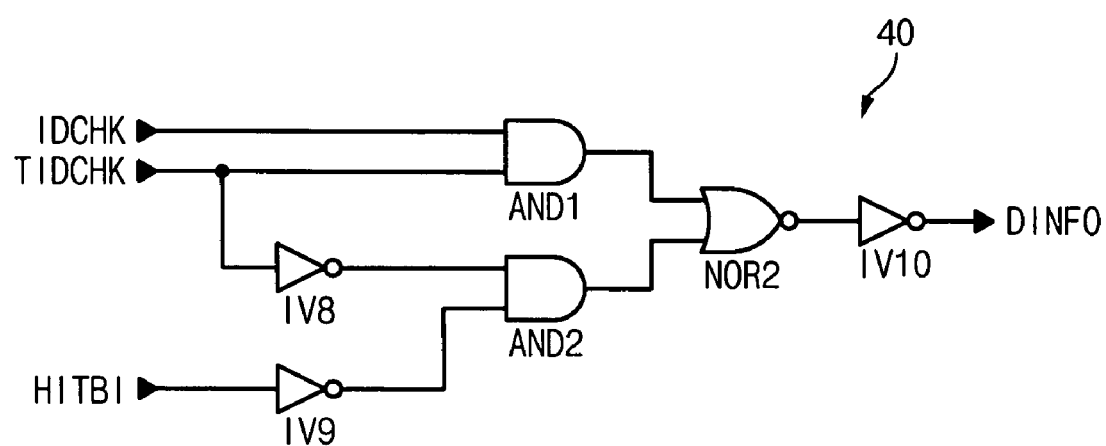
FIG. 5 is a circuit diagram of an information write control unit of FIG. 2.

FIG. 5 is a circuit diagram of the information write control unit 40 of FIG. 2.

The information write control unit 40 comprises inverters IV8~IV10, AND gates AND1 and AND2, and a NOR gate NOR2.

The inverter IV8 inverts the device information test signal TIDCHK, and the inverter IV9 inverts the repair acknowledgement signal HITBI. The AND gate AND1 performs an AND operation on the device information signal IDCHK and the device information test signal TIDCHK. The AND gate AND2 performs an AND operation on output signals from the inverters IV8 and IV9. The NOR gate NOR2 performs a NOR operation on output signals from the AND gates AND1 and AND2. The inverter IV10 inverts an output signal from the NOR gate NOR2.

The above-described information write control unit 40 performs a repair operation if the device information test signal TIDCHK and the device information signal IDCHK are at the low level and the repair acknowledgement signal HITBI is at the high level. As a result, the information write control unit 40 disables the device information output signal DINFO for reading device information to the low level.

On the other hand, the information write control unit 40 performs a device information writing operation if the device information test signal TIDCHK and the device information signal IDCHK are at the high level and the repair acknowledgement signal HITBI is at the low level. As a result, the information write control unit 40 enables the device information output signal DINFO to the high level.

Therefore, the data output unit 50 outputs the device information output signal DINFO including device information to the external DQ pin only when the device information test signal TIDCHK is enabled to the high level.

In addition, when a redundancy address is identical with the device information, the repair circuit unit is not operated so that the normal operation is performed at a normal mode.

As discussed earlier, different data can be written in each bank for reading device information in a device information writing circuit according to an embodiment of the present invention. As a result, the number of fuse sets is reduced to ¼. Additionally, an additional fuse set is not required because a repair operation or a device information writing operation can be selectively performed with a fuse set having relatively low frequency of use from row repair fuse sets.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A device information writing circuit, comprising:
a row address comparison unit comprising a plurality of fuse sets for selecting a fuse set corresponding to an inputted row address and outputting an address comparison signal and fuse enable signal depending on a fuse cutting result of the selected fuse set;
an information writing unit for selectively outputting a repair acknowledgement signal including a row address repair information or a device information signal in response to the fuse enable signal and a device information test signal for reading device information;
an information write control unit for selectively outputting the device information or repair information in response to the repair acknowledgement signal, the device information signal and the device information test signal; and
a data output unit for outputting the device information to an external data output pin in response to the device information test signal.

2. The circuit according to claim 1, wherein the row address comparison unit comprises:
an enable fuse unit for controlling the fuse enable signal depending on a cutting result of a first fuse when a reset signal is inputted;
a plurality of address fuse units for outputting a plurality of fuse selecting signals by selectively controlling the inputted row address depending on a cutting result of a second fuse when the reset signal is inputted; and
a comparison unit for enabling the address comparison signal when the plurality of fuse selecting signals are identical.

3. The circuit according to claim 2, wherein the enable fuse unit comprises:
the first fuse; and
a first switching device for detecting the connection state of the first fuse in response to the reset signal.

4. The circuit according to claim 3, further comprising a constant-current device connected serially to the first switching device.

5. The circuit according to claim 4, further comprising a buffer unit for buffering an output signal from the common node of the first fuse and the first switching device.

6. The circuit according to claim 5, wherein the buffer unit comprises a plurality of inverters.

7. The circuit according to claim 6, further comprising a second switching device for maintaining an input terminal of the buffer unit at a predetermined level in response to an output signal from the plurality of inverters.

8. The circuit according to claim 7, wherein the second switching device is a NMOS transistor.

9. The circuit according to claim 2, wherein the address fuse unit comprises:
the second fuse1 and
a third switching device for detecting the connection state of the second fuse in response to the reset signal.

10. The circuit according to claim 9, further comprising a constant-current device connected serially to the third switching device.

11. The circuit according to claim 10, further comprising a buffer unit for buffering an output signal from the common node of the first fuse and the first switching device.

12. The circuit according to claim 11, wherein the buffer unit comprises a plurality of inverters.

13. The circuit according to claim 12, further comprising a fourth switching device for maintaining an input terminal of the buffer unit at a predetermined level in response to an output signal from the plurality of inverters.

14. The circuit according to claim 13, wherein the fourth switching device is a NMOS transistor.

15. The circuit according to claim 1, wherein while the address comparison signal is enabled, the information writing unit enables the repair acknowledgement signal when the fuse enable signal is enabled and the device information signal when the device information test signal is enabled.

16. The circuit according to claim 1, wherein the information writing unit comprises:
a first NAND gate for performing a NAND operation on the address comparison signal and the fuse enable signal and outputting the repair acknowledgement signal;
a first NOR gate for performing a NOR operation on the fuse enable signal and a signal obtained by inverting the device information test signal;
a second NAND gate for performing a NAND operation on the address comparison signal and an output signal from the first NOR gate; and
a first inverter for inverting an output signal from the second NAND gate and outputting the device information signal.

17. The circuit according to claim 1, further comprising a column address comparison unit for comparing a stored address of a defective cell with an inputted column address, and outputting column address repair information to the information write control unit.

18. The circuit according to claim 17, wherein the information write control unit does not output the device information signal and synthesizes the row address repair information and the column address repair information to output the synthesized signal to the data output unit when the device information test signal is disabled.

19. The circuit according to claim 1, wherein the information write control unit comprises:
a first AND gate for performing an AND operation on the device information signal and the device information test signal;
a second AND gate for performing an AND operation on a signal obtained by inverting the device information test signal and a signal obtained by inverting the repair acknowledgement signal;
a second NOR gate for performing a NOR operation on output signals from the first AND gate and the second AND gate; and
a second inverter for inverting an output signal from the second NOR gate and outputting the device information output signal.

20. The circuit according to claim 1, wherein the device information includes a LOT number, a wafer number and row/column coordinates.

* * * * *